(12) United States Patent
Stamper et al.

(10) Patent No.: US 10,818,763 B1
(45) Date of Patent: Oct. 27, 2020

(54) FIELD-EFFECT TRANSISTORS WITH LATERALLY-SERPENTINE GATES

(71) Applicant: GLOBALFOUNDRIES Inc., Grand Cayman (KY)

(72) Inventors: Anthony K. Stamper, Williston, VT (US); Steven M. Shank, Jericho, VT (US); Michel J. Abou-Khalil, Essex Junction, VT (US); Siva P. Adusumilli, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/405,368

(22) Filed: May 7, 2019

(51) Int. Cl.
*H01L 29/423* (2006.01)
*H01L 21/8234* (2006.01)
*H01L 29/45* (2006.01)
*H01L 27/088* (2006.01)

(52) U.S. Cl.
CPC .. *H01L 29/4238* (2013.01); *H01L 21/823437* (2013.01); *H01L 27/088* (2013.01); *H01L 29/456* (2013.01)

(58) Field of Classification Search
CPC ........... H01L 21/823437; H01L 27/088; H01L 29/4238; H01L 29/456
See application file for complete search history.

(56) References Cited

U.S. PATENT DOCUMENTS

| | | | |
|---|---|---|---|
| 5,955,763 A * | 9/1999 | Lin | H01L 29/78 257/355 |
| 6,486,511 B1 | 11/2002 | Nathanson et al. | |
| 6,501,136 B1 * | 12/2002 | Lin | H01L 29/41758 257/355 |
| 6,541,820 B1 * | 4/2003 | Bol | H01L 29/41758 257/341 |
| 7,589,992 B2 | 9/2009 | Han et al. | |
| 8,058,161 B2 | 11/2011 | Barna et al. | |
| 9,202,906 B2 | 12/2015 | Howell et al. | |
| 2014/0191305 A1 * | 7/2014 | Vorhaus | H01L 29/42356 257/299 |
| 2017/0170274 A1 * | 6/2017 | Wutte | H01L 29/4238 |
| 2018/0247956 A1 | 8/2018 | Stamper et al. | |

OTHER PUBLICATIONS

Xibo Zhang, Sang Lam, P. K. Ko and Mansun Chan, "High-speed mixed signal and RF circuit design with compact waffle MOSFET," Proceedings 2002 IEEE Hong Kong Electron Devices Meeting (Cat. No. 02TH8616), Hong Kong, China, 2002, pp. 103-106.

(Continued)

*Primary Examiner* — Allan R Wilson
(74) *Attorney, Agent, or Firm* — Thompson Hine LLP; Anthony Canale (57) ABSTRACT

Structures for a field-effect transistor and methods of forming a field-effect transistor. A first gate electrode has a first plurality of segments arranged in series to define a first non-rectilinear chain. A second gate electrode is arranged adjacent to the first gate electrode. The second gate electrode includes a second plurality of segments arranged in series to define a second non-rectilinear chain. A source/drain region is laterally arranged between the first gate electrode and the second gate electrode.

20 Claims, 6 Drawing Sheets

(56) References Cited

OTHER PUBLICATIONS

Zhigang Wu, Soichiro Honda, Junya Matsui, Katsuyuki Utaka, Tomohiko Edura, Masahide Tokuda, Ken Tsutsui, and Yasuo Wada, "Tunable Monolithic DWDM Band-Selection Interleaver Filter Switch on Silicon-on-Insulator Substrate," J. Lightwave Technol. 26, 3363-3368 (2008).

P. Bakeman, A. Bergendahl, M. Hakey, D. Horak, S. Luce and B. Pierson, "A high performance 16-Mb DRAM technology," Digest of Technical Papers.1990 Symposium on VLSI Technology, Honolulu, Hawaii, USA, 1990, pp. 11-12.

M. Jaffe et al., "Improvements in SOI technology for RF switches," 2015 IEEE 15th Topical Meeting on Silicon Monolithic Integrated Circuits in RF Systems, San Diego, CA, 2015, pp. 30-32.

\* cited by examiner

FIG. 10

FIELD-EFFECT TRANSISTORS WITH LATERALLY-SERPENTINE GATES

BACKGROUND

The present invention relates to semiconductor device fabrication and integrated circuits and, more specifically, to structures for a field-effect transistor and methods of forming a field-effect transistor.

Device structures for a field-effect transistor generally include a body region, a source and a drain defined in the body region, and a gate electrode configured to switch carrier flow in a channel formed during operation in the body region. When a control voltage exceeding a designated threshold voltage is applied to the gate electrode, the field-effect transistor is switched "on", and carrier flow occurs in the channel between the source and drain to produce a device output current.

Complementary metal-oxide semiconductor (CMOS) circuitry may be utilized in mobile communication devices (e.g., laptops, cellular phones, tablets, etc.) to handle high-frequency signals transmitted to and/or received by the mobile communication devices. The circuitry on a chip may include a low noise amplifier and a high-frequency switch that allows for high-frequency signals received by an antenna to be routed from the low noise amplifier to other chip circuitry and for high-frequency signals to be routed from a power amplifier to the antenna. The high-frequency switch may include a stack or bank of field-effect transistors formed by CMOS processes.

The bank of field-effect transistors may include multiple gate fingers that have a rectilinear parallel arrangement in the device layout. Sources and drains are arranged in the spaces between the adjacent gate fingers. Due to the rectilinear parallel arrangement of the gate fingers in the device layout, the bank of field-effect transistors may occupy a large area that makes inefficient use of the available space on a chip.

Improved structures for a field-effect transistor and methods of forming a field-effect transistor are needed.

SUMMARY

In an embodiment, a structure is provided for a field-effect transistor. The structure includes a first gate electrode having a first plurality of segments arranged in series to define a first non-rectilinear chain, and a second gate electrode arranged adjacent to the first gate electrode. The second gate electrode includes a second plurality of segments arranged in series to define a second non-rectilinear chain. The second plurality of segments are displaced laterally from the first plurality of segments of the first non-rectilinear chain of the first gate electrode. The structure further includes a source/drain region arranged laterally between the first gate electrode and the second gate electrode.

In an embodiment, a method is provided for forming a field-effect transistor. The method includes forming a first gate electrode including a first plurality of segments arranged in series to define a first non-rectilinear chain, and forming a second gate electrode arranged adjacent to the first gate electrode. The second gate electrode includes a second plurality of segments arranged in series to define a second non-rectilinear chain. The second plurality of segments are displaced laterally from the first plurality of segments of the first non-rectilinear chain of the first gate electrode. A source/drain region is arranged laterally between the first gate electrode and the second gate electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

FIG. 5 is a simplified top view in which FIG. 4 is taken generally along line 4-4.

DETAILED DESCRIPTION

Figure 1:
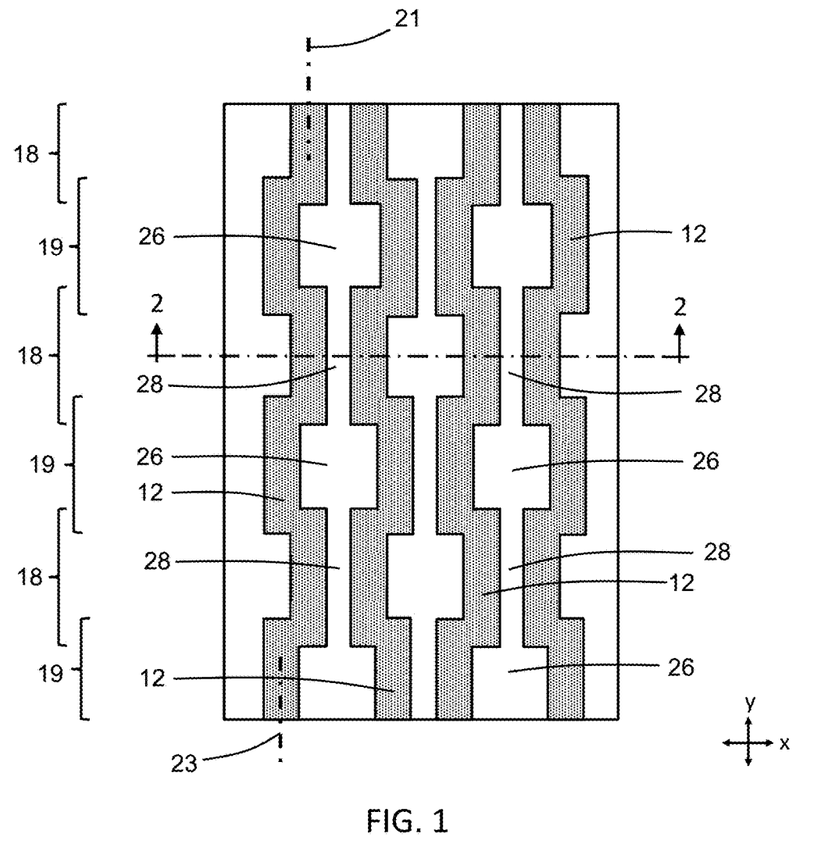
FIG. 1 is a top view of a device structure at an initial fabrication stage of a processing method in accordance with embodiments of the invention.
Figure 2:
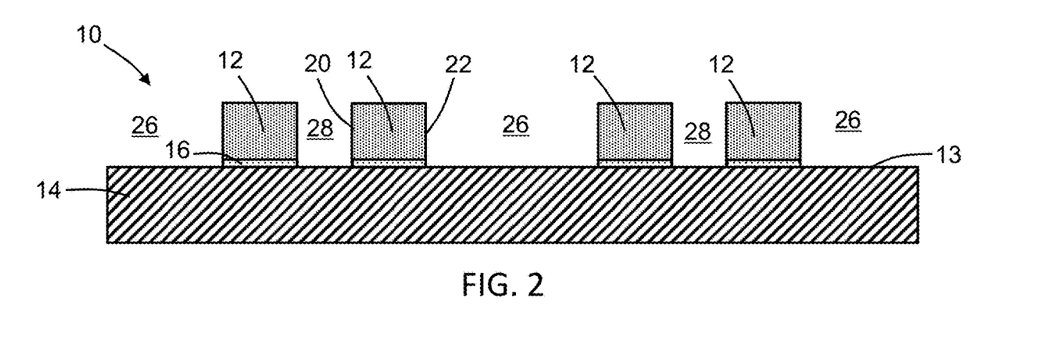
FIG. 2 is a cross-sectional view taken generally along line 2-2 in FIG. 1.

With reference to FIGS. 1, 2 and in accordance with embodiments of the invention, a structure 10 for a field-effect transistor includes gate electrodes 12 arranged in an array as a set of fingers on a top surface 13 of a semiconductor substrate 14. The semiconductor substrate 14 may be, for example, a bulk semiconductor wafer composed of a single-crystal semiconductor material, such as single-crystal silicon, or a top crystalline film of a silicon-on-insulator (SOI) wafer. A doped well (not shown) may be formed in the semiconductor substrate 14. The doped well may be provided by ion implanting a dopant having a given conductivity type, such as boron to provide p-type conductivity for an NFET well or phosphorus to provide n-type conductivity for a PFET well. The gate electrodes 12 and doped well may be formed in an active device region of the semiconductor substrate 14 that is surrounded by a shallow trench isolation (STI) region (not shown). The STI region may, for example, surround outer edges of the array of gate electrodes 12 to provide isolation with respect to adjacent field-effect transistors, or with respect to other adjacent active or passive devices.

A gate dielectric layer 16 is arranged between each gate electrode 12 and the top surface 13 of the semiconductor substrate 14. The gate dielectric layer 16 may be composed of a dielectric material, such as silicon dioxide grown by a wet or dry thermal oxidation process of the semiconductor material of the semiconductor substrate 14 or silicon dioxide deposited by atomic layer deposition. The gate electrodes 12 may be composed of a doped semiconductor material, such as doped polycrystalline silicon (i.e., polysilicon), deposited by chemical vapor deposition. The gate electrodes 12 may be formed by lithography and etching processes that pattern a deposited layer of its constituent material, as well as a deposited layer of the material constituting the gate dielectric layer 16. The lithography process may form an etch mask that includes a layer of a light-sensitive material, such as an organic photoresist, applied by a spin coating process, pre-baked, exposed to light projected through a photomask, baked after exposure, and developed with a chemical developer to form the resist shapes that cover respective areas on the deposited layers of the constituent materials. These areas are masked during the etching process to provide the gate electrodes 12 and gate dielectric layer 16 under each gate electrode 12. Alternatively, the gate dielectric layer 16 may be composed of a high-k dielectric material, such as hafnium oxide, and the gate electrodes 12 may be composed of one or more metals formed by, for example, a metal gate process or a replacement metal gate process.

The gate electrodes 12 are patterned to form multiple segments 18, 19 arranged in series that exhibit shifts in direction relative to each other along their lengths such that the individual gate electrodes 12 are not rectilinear. In an embodiment, the shifts in direction may occur in a given direction (e.g., the x-direction) within a plane. Areas or portions of the semiconductor substrate 14 are exposed in the wide regions 26 laterally between the segments 18, 19 of adjacent gate electrodes 12, and other areas or portions of the semiconductor substrate 14 are exposed in the narrow regions 28 laterally between the segments 18 of adjacent gate electrodes 12. In an embodiment, the segments 18, 19 may have nominally the same length dimension along a lengthwise direction (e.g., the y-direction). In an embodiment, the segments 18, 19 may have nominally the same width dimension along a direction (e.g., the x-direction) in the plane that is transverse to the lengthwise direction. The shifts of the segments 18, 19 may impart an S-shape to each gate electrode 12.

The segments 18, 19 in the serial arrangement of each gate electrode 12 define a non-rectilinear string or chain in which alternating segments 18, 19 are laterally displaced. The pattern of segments 18, 19 along the length of the gate electrodes 12 is complementary to the pattern of each adjacent gate electrode 12 such that the segments 18, 19 are mirrored among adjacent pairs of the gate electrodes 12. Each gate electrode 12 includes opposite sidewalls 20, 22 that reflect the contour of the non-rectilinear arrangement of the segments 18, 19. The distance between the sidewall 20 and the opposite sidewall 22 of each gate electrode 12 defines a channel length in the underlying semiconductor substrate 14. The segments 18 may be aligned along a longitudinal axis 21, and the segments 19 may be aligned along a longitudinal axis 23 that is offset laterally (i.e., in the x-direction) from the longitudinal axis 21. The segments 18, 19 of each gate electrode 12 are distributed to alternate in the corresponding non-rectilinear chain between alignment of segments 18 along the longitudinal axis 21 and alignment of the segments 19 along the longitudinal axis 23.

Figure 1A:
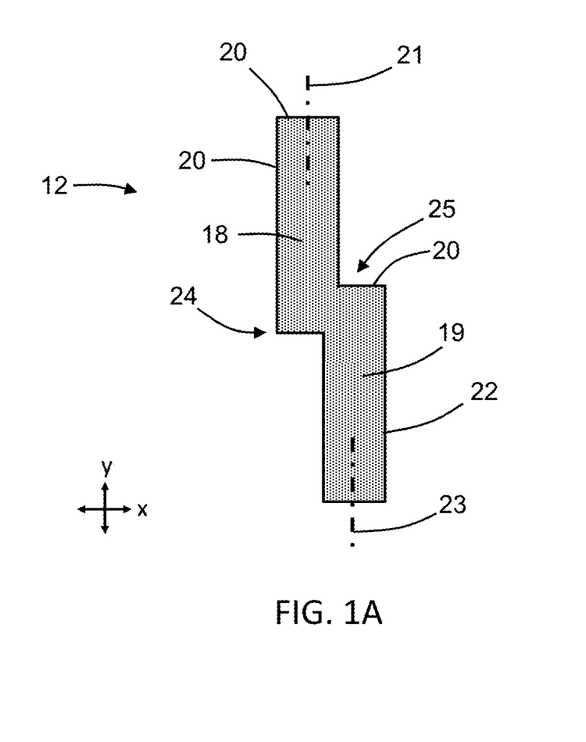
FIG. 1A is an enlarged view of a portion of FIG. 1 in which the gate electrode corners are right angles.

The lateral displacement between the different rectilinear chains imparts a varying width dimension to the space between the nearest-neighbor sidewalls 20 and 22. In particular, the sidewall 20 of one gate electrode 12 and the sidewall 22 of an adjacent, nearest-neighbor gate electrode 12 have a spacing associated with the wide regions 26 and a different spacing associated with the narrow regions 28 that is less than the spacing associated with the wide regions 26. The sidewalls 20, 22 of each gate electrode 12 also include outside corners 24 and inside corners 25 where the segments 18, 19 have an overlapping arrangement. At each of the corners 24, 25, the respective sidewalls 20, 22 change in direction and, in an embodiment, the direction change may be approximately equal to a right-angle (i.e., 90°).

Figure 1B:
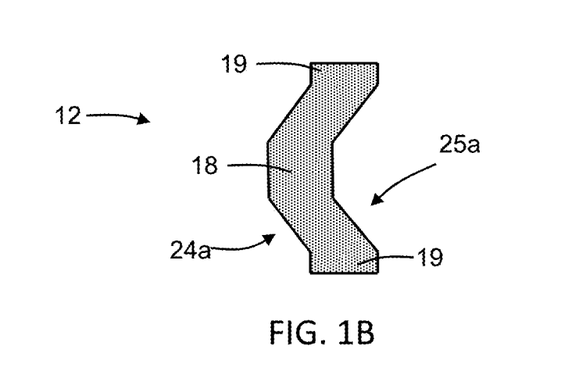
FIG. 1B is an enlarged view similar to FIG. 1A of a portion of a gate electrode in accordance with alternative embodiments of the invention and in which the gate electrode corners are chamfered.

As shown in FIG. 1B, the corners 24a, 25a of the gate electrodes 12 may be chamfered to eliminate right angles and to smoothen the sidewalls 20, 22. The chamfering of the corners 24a, 25a of the gate electrodes may be provided during patterning by, for example, optical proximity correction that adds serifs to the photomask used during lithography. The corner chamfering may operate, for example, to maintain the channel length more constant over the entire length of each gate electrode 12.

Halos and source/drain extensions (not shown) may be formed in the semiconductor substrate 14 after the patterning of the gate electrodes 12. The halos and source/drain extensions may be formed by ion implantation of one or more dopants having given conductivity types.

Figure 3:
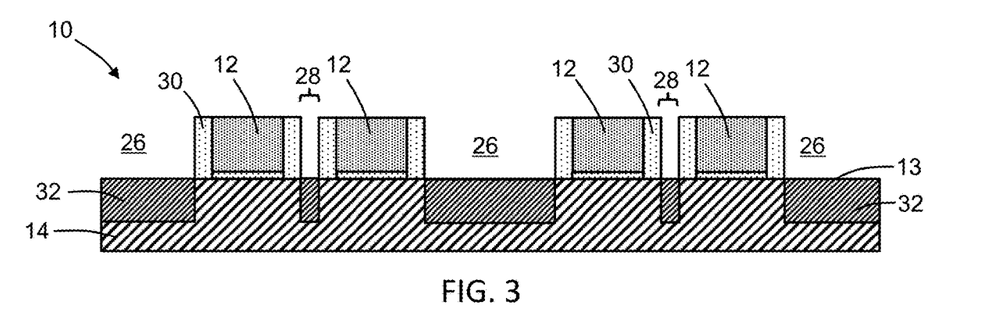
FIG. 3 is a cross-sectional view of the device structure at a fabrication stage subsequent to FIG. 2.

With reference to FIG. 3 in which like reference numerals refer to like features in FIGS. 1, 2 and at a subsequent fabrication stage, sidewall spacers 30 are formed at the sidewalls 20, 22 of the gate electrodes 12. The sidewall spacers 30 may be formed by depositing a conformal layer composed of a dielectric material, such as silicon dioxide, silicon nitride, or a low-k dielectric material, with atomic layer deposition, chemical vapor deposition, plasma-enhanced chemical vapor deposition, etc. and etching the deposited layer with an anisotropic etching process, such as reactive ion etching. The deposition is controlled such that the conformal layer does not reach a thickness that could pinch-off the narrow regions 28. The anisotropic etching process may be a blanket etching process that can be performed without the presence of a pre-applied etch mask or that may also be performed with a pre-applied etch mask. The sidewall spacers 30 follow the non-rectilinear arrangement of the segments 18, 19 and, in particular, follow the contour of the sidewalls 20, 22 of the gate electrodes 12 with lateral changes in direction introduced by the lateral shifts of the segments 18, 19.

The structure 10 further includes source/drain regions 32 of a given conductivity type that are formed in the semiconductor substrate 14 adjacent to, and on opposite sides of, each gate electrode 12 and its sidewall spacers 30. In particular, the source/drain regions 32 are formed in the regions 26, 28 between the gate electrodes 12 and acquire the alternating width dimension along the length of the gate electrodes 12. The source/drain regions 32 may be formed by introducing a dopant into the semiconductor substrate 14. In an embodiment, the source/drain regions 32 may be formed by implanting ions containing the dopant under a given set of implantation conditions (e.g., ion species, dose, kinetic energy, tilt angle) into the semiconductor substrate 14. In an embodiment, the source/drain regions 32 may contain a concentration of an n-type dopant (e.g., phosphorus, arsenic, and/or antimony) that provides n-type conductivity. The ions used to form the source/drain regions 32 may be generated from a suitable source gas and implanted into the semiconductor substrate 14 with the given set of implantation conditions using an ion implantation tool. The given set of implantation conditions may be selected to tune the electrical and physical characteristics (e.g., electrical resistivity and depth profile) of the source/drain regions 32.

Figure 4:
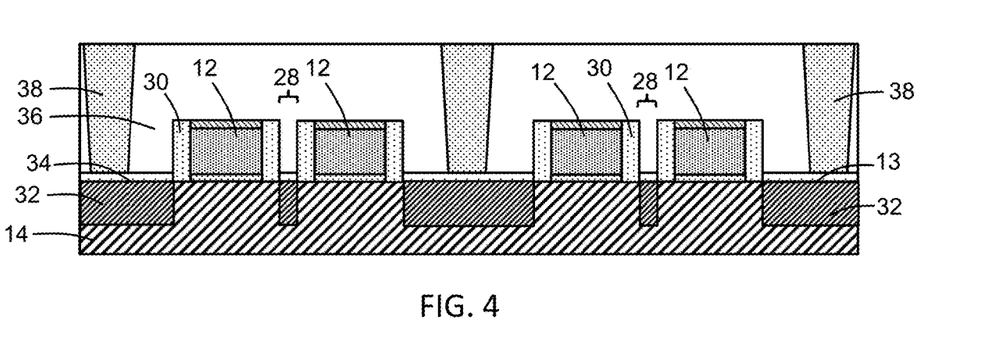
FIG. 4 is a cross-sectional view of the device structure at a fabrication stage subsequent to FIG. 3.
Figure 5:
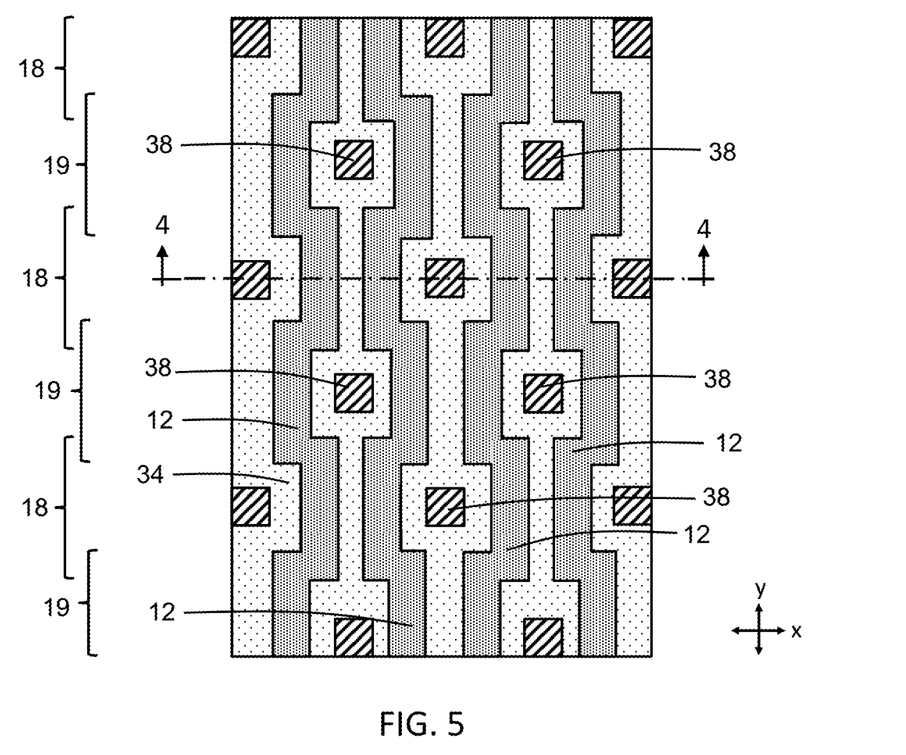

With reference to FIGS. 4, 5 in which like reference numerals refer to like features in FIG. 3 and at a subsequent fabrication stage, sections of a silicide layer 34 may be formed on the top surface 13 of the semiconductor substrate 14 in the regions 26, 28 between each pair of the gate electrodes 12 over the source/drain regions 32. The silicide layer 34 has a lower resistance than the semiconductor substrate 14 and facilitates subsequent contact formation with the source/drain regions 32. The silicide layer 34 may be formed by a self-aligned silicidation process involving the deposition of a layer of a silicide-forming metal by, for example, chemical vapor deposition or physical vapor deposition, followed by one or more annealing steps (e.g., rapid thermal annealing) to form a silicide phase by reacting the layer of silicide-forming metal and the contacting semiconductor material of the semiconductor substrate 14. Because the silicide-forming metal does not react with contacted dielectric material, such as the sidewall spacers 30, the silicidation process is self-aligned to areas on the top surface 13 of the semiconductor substrate 14 in the regions 26, 28. Candidate materials for the silicide-forming metal include, but are not limited to, nickel, titanium, cobalt, palladium, platinum, or a combination of these metals or other metals capable of reacting with a semiconductor material (e.g., silicon) to form a low-resistivity, thermally-stable silicide. Sections of the silicide layer 34, or sections of a different silicide layer, may also be formed on the top surface of the gate electrodes 12.

Middle-of-line (MOL) processing and back-end-of-line (BEOL) processing follow, which includes formation of contacts, vias, and wiring for an interconnect structure coupled with the field-effect transistor. The interconnect structure includes a dielectric layer 36 and contacts 38 arranged in contact openings in the dielectric layer 36 as vertical interconnections extending to the source/drain regions 32. Contacts (not shown) may also be formed that are connected with the sections of the silicide layer 34 on the gate electrodes 12.

The contacts 38 are coupled with sections of the silicide layer 34 in the wide regions 26 laterally between the segments 18 of adjacent gate electrodes 12. Sections of the silicide layer 34 are also present in the narrow regions 28 laterally between the segments 18 of adjacent gate electrodes 12, which are not contacted.

The structure may be a switch constructed as a multi-finger field-effect transistor. The shape of the gate electrodes 12 may permit more gate electrodes 12 to be placed in a given device footprint with an area-efficient layout that features a higher density of gate electrodes. The density improvements are accomplished while satisfying ground rules for the layout, which include, but are not limited to, the gate length, the contact width, and the contact-to-gate minimum spacing.

Figure 6:
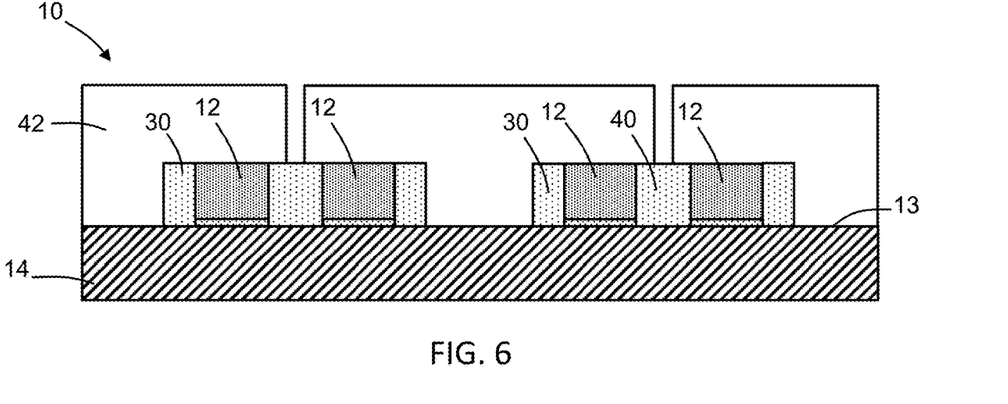
FIG. 6 is a cross-sectional view of a device structure at an initial fabrication stage of a processing method in accordance with alternative embodiments of the invention.

With reference to FIG. 6 in which like reference numerals refer to like features in FIG. 1 and at a subsequent fabrication stage in accordance with alternative embodiments, the sidewall spacers 30 may be formed at the sidewalls of the gate electrodes 12 with a greater thickness. In particular, a conformal layer 40 may be deposited with a thickness sufficient to pinch-off inside the narrow regions 28. The conformal layer 40 is not fully etched in the narrow regions 28 by the etching process forming the sidewall spacers 30 due to the narrowness of the narrow regions 28 in comparison with the wide regions 26. The thickening of the sidewall spacers 30 does not interfere with the formation of the contacts 38 in the wide regions 26.

After forming the sidewall spacers 30, an etch mask 42 may be formed by lithography over the semiconductor substrate 14. The etch mask 42 may include a layer of, for example, an organic photoresist that is applied by a spin coating process, pre-baked, exposed to light projected through a photomask, baked after exposure, and developed with a chemical developer to define openings at the intended locations of cuts to be formed in the conformal layer 40 in the narrow regions 28. The cuts are needed to divide the conformal layer 40 into additional spacers 30 and to reopen the narrow regions 28 for the subsequent formation of the silicide layer 34.

Figure 7:
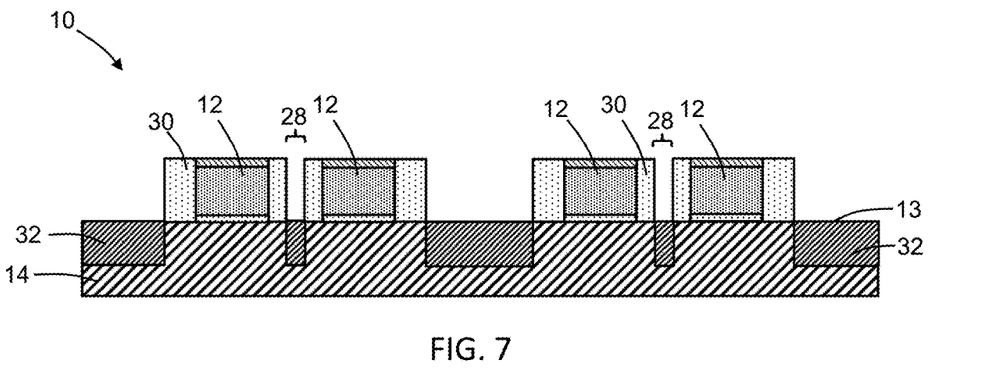
FIGS. 7 and 8 are cross-sectional views of the device structure at successive fabrication stages subsequent to FIG. 6.

With reference to FIG. 7 in which like reference numerals refer to like features in FIG. 6 and at a subsequent fabrication stage, an etching process is used to remove the material of the conformal layer 40 over portions of the narrow regions 28 that are not masked by the etch mask 42. The etching process may be an anisotropic etching process, such as reactive ion etching, that is selected to stop on the semiconductor material of the semiconductor substrate 14. The size and arrangement of the openings in the etch mask 42 determine the dimensions and locations of the sidewall spacers 30 formed in the narrow regions 28.

Figure 8:
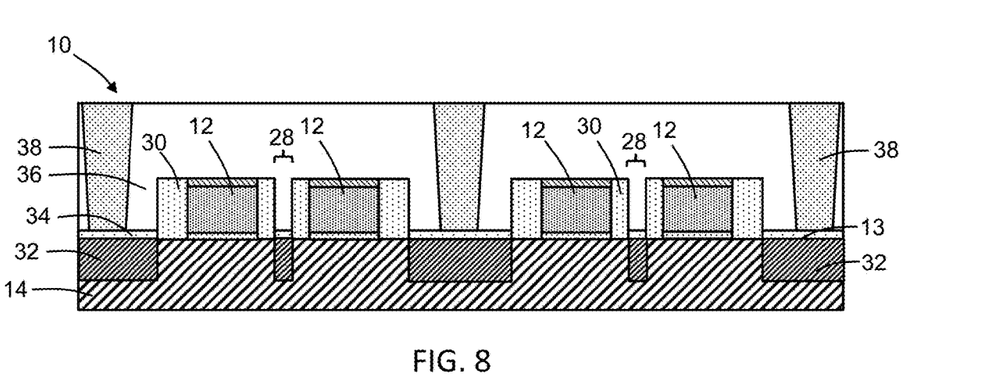

With reference to FIG. 8 in which like reference numerals refer to like features in FIG. 7 and at a subsequent fabrication stage, processing continues to form the source/drain regions 32, and then as described in connection with FIGS. 4, 5 to complete the formation of the field-effect transistor. The increased thickness of the sidewall spacers 30 may effectively reduce the dimensions of the source/drain regions 32.

Figure 9:
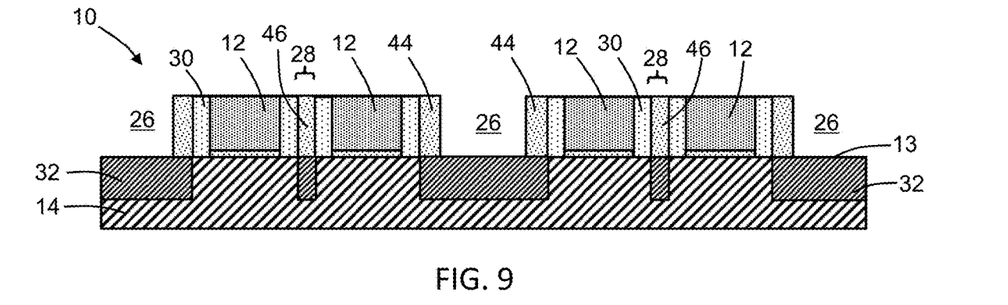
FIG. 9 is a cross-sectional view of a device structure at a fabrication stage in accordance with alternative embodiments of the invention.

With reference to FIG. 9 in which like reference numerals refer to like features in FIG. 1 and in accordance with alternative embodiments, the sidewall spacers 30 may be formed at the sidewalls of the gate electrodes 12 with a thickness selected to not pinch off the narrow regions 28. Following the formation of the sidewall spacers 30, the active device region of the semiconductor substrate 14 may be implanted with masked or unpatterned implants to dope halo regions, extension regions, and/or source/drain regions 32 of the structure 10. Sacrificial spacers 44 may be subsequently formed adjacent to the sidewall spacers 30 in the wide regions 26. The sacrificial spacers 44 may be formed by depositing a conformal layer composed of a material, such as silicon dioxide, silicon nitride, or a low-k dielectric material, with atomic layer deposition and etching the deposited layer with an anisotropic etching process, such as reactive ion etching. A portion 46 of the conformal layer pinches off inside the narrow regions 28 such that the space between the sidewall spacers 30 in the narrow regions 28 is filled and closed. The material of the sacrificial spacers 44 is chosen to permit selective removal relative to the material of the sidewall spacers 30. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process. In an embodiment, the sidewall spacers 30 may be composed of silicon dioxide, the sacrificial spacers 44 and the portion 46 of the conformal layer may be composed of silicon nitride, and the silicon nitride may be removed selectively relative to the silicon dioxide and without lithography and a photomask using, for example, aqueous phosphoric acid. As described in connection with FIGS. 4, 5, processing further continues after forming the sacrificial spacers 44 to complete the formation of the structure 10 for the field-effect transistor.

Figure 10:
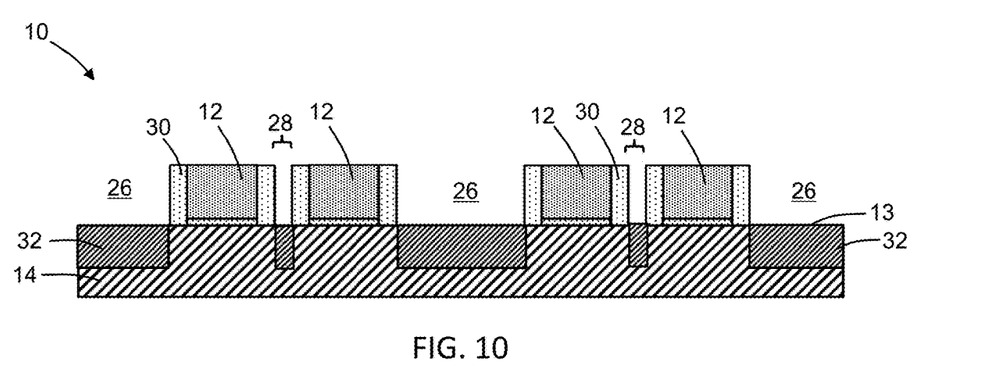
FIG. 10 is a cross-sectional view of a device structure at a fabrication stage in accordance with alternative embodiments of the invention.

With reference to FIG. 10 in which like reference numerals refer to like features in FIG. 9 and in accordance with alternative embodiments, after additional processing and prior to the formation of the silicide layer 34, the sacrificial spacers 44 and the portion 46 of the conformal layer may be removed from between the sidewall spacers 30 in the narrow regions 28. As described in connection with FIGS. 4, 5, processing further continues to complete the formation of the structure 10 for the field-effect transistor. The temporarily-increased thickness of the sidewall spacers 30 due to the presence of the sacrificial spacers 44 reduces the dimensions of the source/drain regions 32 similar to the widened spacers of FIGS. 6-8.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
    a first gate electrode including a first plurality of segments arranged in series to define a first non-rectilinear chain;
    a second gate electrode arranged adjacent to the first gate electrode, the second gate electrode including a second plurality of segments arranged in series to define a second non-rectilinear chain, the second plurality of segments displaced laterally from the first plurality of segments of the first non-rectilinear chain of the first gate electrode, the second plurality of segments spaced and arranged relative to the first plurality of segments of the first gate electrode to alternate between a first spacing and a second spacing that is less than the first spacing;
    a source/drain region laterally arranged between the first gate electrode and the second gate electrode, the source/drain region including a first plurality of regions between the first plurality of segments and the second plurality of segments with the first spacing, and the source/drain region including a second plurality of regions between the first plurality of segments and the second plurality of segments with the second spacing; and
    a silicide layer having a plurality of first sections respectively on the first plurality of regions of the source/drain region and a plurality of second sections respectively on the second plurality of regions of the source/drain region.

2. The structure of claim 1 further comprising:
    a contact level over the first gate electrode, the second gate electrode, and the source/drain region, the contact level including a plurality of contacts respectively coupled with the first plurality of regions of the source/drain region.

3. The structure of claim 2 wherein the second plurality of regions of the source/drain region are uncontacted.

4. The structure of claim 1 wherein the first plurality of segments of the first gate electrode include a plurality of corners defined proximate to the first plurality of regions of the source/drain region.

5. The structure of claim 4 wherein each of the plurality of corners is chamfered.

6. The structure of claim 1 wherein the first gate electrode has a first sidewall, the second gate electrode has a second sidewall, and the first sidewall of the first gate electrode is spaced from the second sidewall of the second gate electrode with either the first spacing or the second spacing.

7. The structure of claim 1 wherein the first gate electrode includes a sidewall with a contour that exhibits changes in direction that reflect the first non-rectilinear chain of the first plurality of segments, and further comprising:
    a sidewall spacer adjacent to the sidewall of the first gate electrode, the sidewall spacer arranged to follow the contour of the sidewall of the first gate electrode.

8. The structure of claim 1 wherein the first plurality of segments are distributed to alternate in the first non-rectilinear chain between alignment along a first longitudinal axis and alignment along a second longitudinal axis that is laterally offset relative to the first longitudinal axis.

9. The structure of claim 1 wherein the second plurality of regions have a first width dimension, and the second plurality of regions have a second width dimension that is less than the first width dimension.

10. The structure of claim 1 wherein the first plurality of segments of the first gate electrode and the second plurality of segments of the second gate electrode have nominally equal width dimensions.

11. A method of forming a field-effect transistor, the method comprising:
   forming a first gate electrode including a first plurality of segments arranged in series to define a first non-rectilinear chain;
   forming a second gate electrode arranged adjacent to the first gate electrode;
   forming a source/drain region arranged laterally between the first gate electrode and the second gate electrode; and
   forming a silicide layer on the source/drain region,
   wherein the second gate electrode includes a second plurality of segments arranged in series to define a second non-rectilinear chain, the second plurality of segments are spaced and arranged relative to the first plurality of segments of the first gate electrode to alternate between a first spacing and a second spacing that is less than the first spacing, the source/drain region includes a first plurality of regions between the first plurality of segments and the second plurality of segments with the first spacing, the source/drain region includes a second plurality of regions between the first plurality of segments and the second plurality of segments with the second spacing, and the silicide layer has a plurality of first sections respectively on the first plurality of regions of the source/drain region and a plurality of second sections respectively on the second plurality of regions of the source/drain region.

12. The method of claim 11 wherein the first gate electrode includes a first sidewall with a first contour exhibiting changes in direction that reflect the first non-rectilinear chain of the first plurality of segments, and further comprising:
   forming a first sidewall spacer adjacent to the first sidewall of the first gate electrode,
   wherein the first sidewall spacer is arranged to follow the first contour of the first sidewall of the first gate electrode.

13. The method of claim 12 wherein the second gate electrode includes a second sidewall with a second contour exhibiting changes in direction that reflect the second non-rectilinear chain of the second plurality of segments, the second sidewall of the second gate electrode is arranged adjacent to the first sidewall of the first gate electrode, and further comprising:
   forming a second sidewall spacer adjacent to the second sidewall of the second gate electrode,
   wherein the second sidewall spacer is arranged to follow the second contour of the second sidewall of the first gate electrode.

14. The method of claim 13 wherein the second plurality of regions have a first width dimension, and the second plurality of regions have a second width dimension that is less than the first width dimension.

15. The method of claim 13 wherein forming the first sidewall spacer adjacent to the first sidewall of the first gate electrode comprises:
   depositing a dielectric layer that fills spaces between the first sidewall and the second sidewall over the second plurality of regions of the source/drain region; and
   patterning the dielectric layer in the spaces with lithography and etching processes to form the first sidewall spacer in the second plurality of regions.

16. The method of claim 13 wherein forming the first sidewall spacer adjacent to the first sidewall of the first gate electrode comprises:
   depositing a dielectric layer that includes a first portion on the first sidewall and a second portion on the second sidewall over the second plurality of regions of the source/drain region; and
   forming a sacrificial spacer in each space between the first portion of the dielectric layer and the second portion of the dielectric layer in the second plurality of regions.

17. The method of claim 16 further comprising:
   removing the sacrificial spacer from each space,
   wherein the silicide layer is formed on the source/drain region after removing the sacrificial spacer from each space.

18. The method of claim 11 further comprising:
   forming a contact level over the first gate electrode, the second gate electrode, and the source/drain region,
   wherein the contact level includes a plurality of contacts respectively coupled with the first plurality of regions of the source/drain region.

19. The method of claim 11 wherein the first gate electrode includes a sidewall, and forming the first gate electrode including the first plurality of segments arranged in series to define the first non-rectilinear chain comprises:
   patterning the first plurality of segments with chamfered corners at changes in direction of the sidewall of the first gate electrode produced by the first non-rectilinear chain.

20. The method of claim 11 wherein the source/drain region is formed by ion implantation.

* * * * *